United States Patent [19]

Lee

[11] Patent Number: 5,821,789
[45] Date of Patent: Oct. 13, 1998

[54] FAST SWITCHING PHASE-LOCKED LOOP

[75] Inventor: Jeng-Shing Lee, Hsinchu, Taiwan

[73] Assignee: Industrial Technology Research Institution, Hsinchu Hsien, Taiwan

[21] Appl. No.: 789,806

[22] Filed: Jan. 28, 1997

[51] Int. Cl.$^6$ .............................. H03D 3/24; H04L 23/60
[52] U.S. Cl. ......................... 327/156; 327/148; 327/157; 375/374; 331/17
[58] Field of Search .................................. 327/105, 147, 327/148, 156, 157, 552; 331/6, 17, 14; 375/327, 374, 375, 376; 455/260

[56] References Cited

U.S. PATENT DOCUMENTS 5,175,729  12/1992  Borras et al. ............................ 455/260
5,740,213   4/1998  Dreyer .................................... 327/157

Primary Examiner—Timothy P. Callahan
Assistant Examiner—Dinh Le
Attorney, Agent, or Firm—McDermott, Will & Emery

[57] ABSTRACT

A fast switching phase-locked loop that substantially reduces the response time and the noise is disclosed. The present invention includes a voltage-controlled oscillator, which generates an ac output signal whose frequency is proportional to a control signal. A divider is used to generate a division signal whose frequency is an integer division of the ac output signal. The present invention also includes a phase detector, which generates a detect signal proportional to a phase difference of the division signal and a reference signal, therefore making the frequency of the ac output signal be an integer multiple of the reference signal. A first filter is used to shape the overall response during a fore part of switching period by generating the control signal according to the detect signal, and the first filter is then prohibited during a later part of the switching period. A second filter is further used to shape the overall response during the later part of switching period by generating the control signal according to the detect signal, where the bandwidth of the first filter is larger than the bandwidth of the second filter.

8 Claims, 6 Drawing Sheets

FAST SWITCHING PHASE-LOCKED LOOP

BACKGROUND OF THE INVENTION

1. Field of the Invention

The present invention relates to a phase-locked loop circuit, and particularly to a fast switching phase-locked loop circuit.

2. Description of the Prior Art

Phase-locked loop (PLL) is widely used in many applications such as clock recovery, modulation, demodulation and frequency synthesis to control the frequency and/or phase of a signal. As the design and implementation of the PLLs in large-scale integrated circuits are improved, integrated PLL circuits become available to implement PLL-related applications. Frequency synthesizer, for example, is used in radio communication equipment to produce a stable frequency source, which is then utilized to turn to a desired radio channel.

A PLL is a circuit that uses feedback to lock an output signal in phase with a reference signal. FIG. 1 shows the block diagram of a conventional PLL circuit. A voltage-controlled oscillator (VCO) 10 is used to produce an ac output signal, whose frequency is controlled under and usually proportional to an input voltage. A divide by N circuit 12 inputs the ac output signal from the VCO 10, and generates another ac output signal whose frequency is N division of the input signal. The phase difference of the divided-by-N signal and a reference signal are compared by a phase detector 14, which then generates an output signal proportional to the phase difference. Prior to the use of this output signal of the phase detection 14 to control the VCO 10, the output signal of the phase detector 14 is firstly processed by a charge pump 16 and a followed-up loop filter 18. The charge pump 16 is particularly used in a digital PLL circuit as an interface circuit between the digital phase detector 14 and the analog loop filter 18. Finally, the loop filter 18 is used to shape the response of the PLL circuit, and therefore to control the dynamics and performance of the PLL circuit.

As the speed of most electronic systems improves due to the advance of circuit design and manufacture technique, the demand for a fast switching PLL circuit that has a short switching time or recovery lapse thus increases. In making such a fast switching PLL, a designer is faced with a dilemma to make compromise between fast switch and low noise. While the PLL is required fast response by designing a wide-band loop filter 18, the noise caused by the loop filter 18 increases accordingly. On the contrary, if the noise in the loop filter 18 is reduced by narrowing the bandwidth of the loop filter 18, the PLL nevertheless becomes slow. A need has therefore been arisen to design a fast switching PLL circuit without incurring more noise.

SUMMARY OF THE INVENTION

In accordance with the present invention, a fast switching phase-lock loop circuit is provided for substantially reducing the response time and the noise. In one embodiment, the phase-locked loop circuit includes a voltage-controlled oscillator, which generates an ac output signal whose frequency is proportional to a control signal. A divider is used to generate a division signal whose frequency is an integer division of the ac output signal. The present invention also includes a phase detector, which generates a detect signal proportional to a phase difference of the division signal and a reference signal, therefore making the ac output signal be an integer multiple of the reference signal. A first filter is used to shape the overall response during a fore part of switching period by generating the control signal according to the detect signal, and the first filter is then prohibited during a later part of the switching period. In the embodiment of the present invention, the first filter includes: a first charge pump for interfacing the detect signal to the first filter, and a first loop filter for filtering a first output signal from the first charge pump, thereby generating the control signal. A second filter is further used to shape the overall response during the later part of switching period by generating the control signal according to the detect signal, where the bandwidth of the first filter is larger than the bandwidth of the second filter. In the embodiment of the present invention, the second filter includes: a second charge pump for interfacing the detect signal to the second filter, and a second loop filter for filtering a second output signal from the second charge pump, thereby generating the control signal. The PLL circuit according to the present invention has a fast switching time or response time due to the large bandwidth of the first loop filter. Further, the present invention accumulates less noise due to the fact that during a later period, little noise is incurred because of the narrow bandwidth in the second loop filter.

DESCRIPTION OF THE PREFERRED EMBODIMENT

Figure 1:
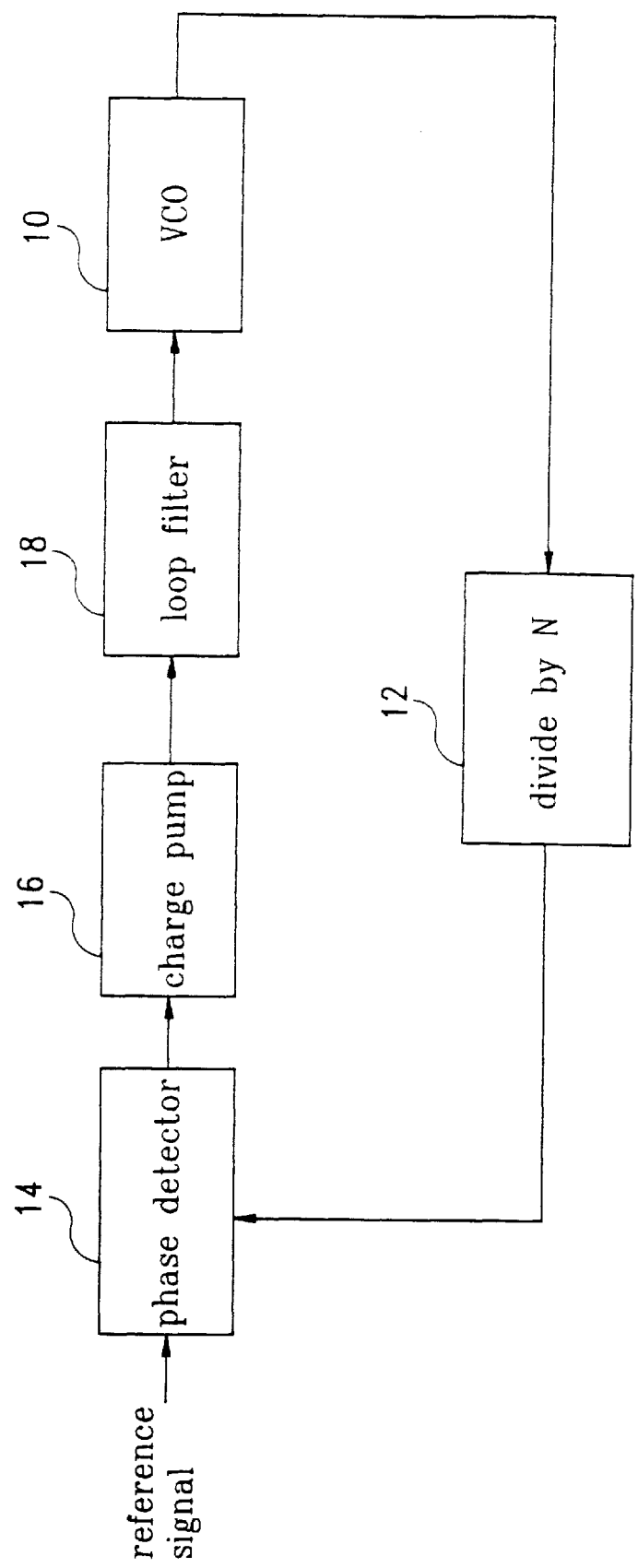
FIG. 1 shows the block diagram of a conventional phase-locked loop circuit.
Figure 2:
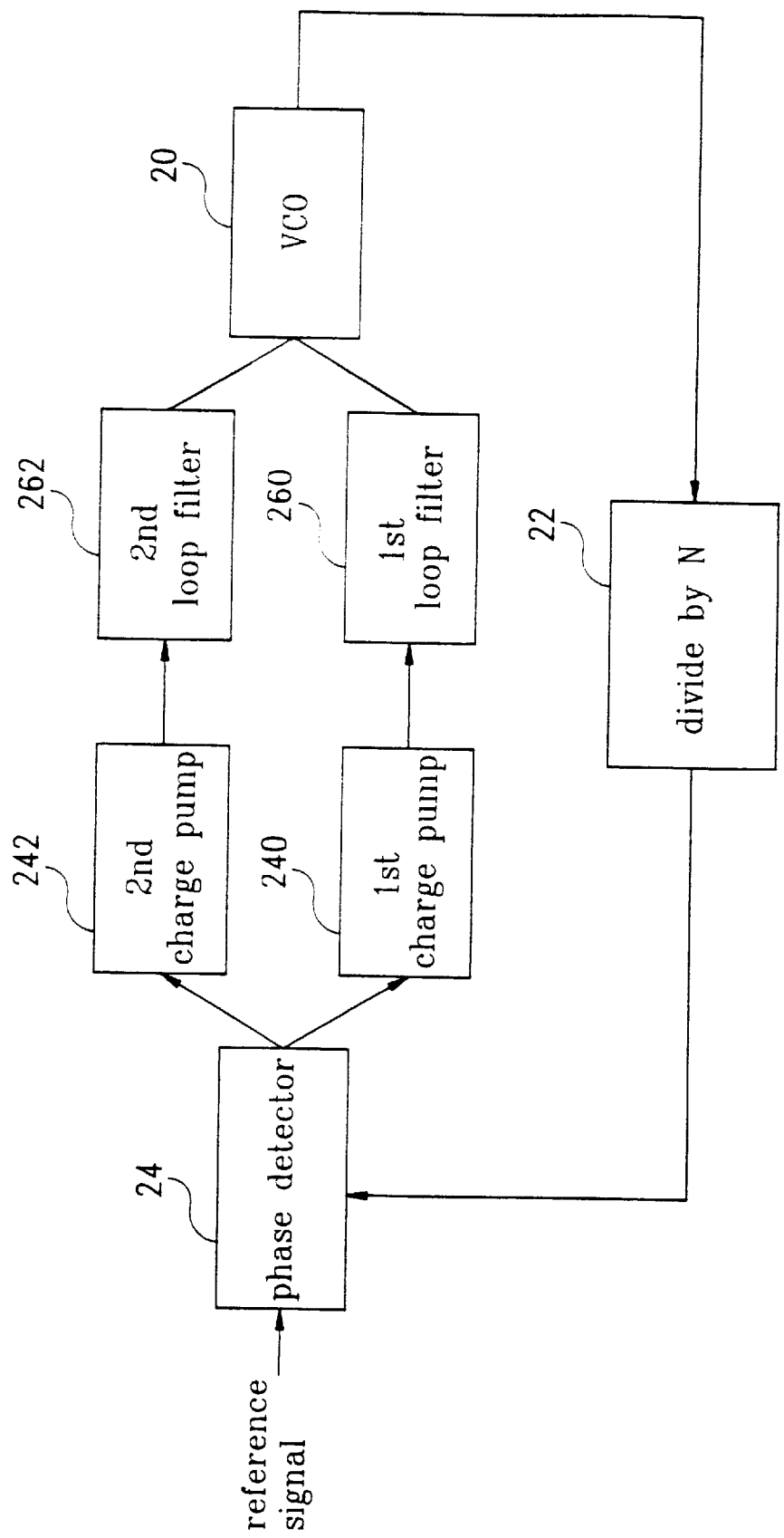
FIG. 2 shows the block diagram of a fast switching phase-locked loop according to one embodiment of the present invention.

FIG. 2 shows the block diagram of a fast switching phase-locked loop (PLL) according to one embodiment of the present invention. A voltage-controlled oscillator (VCO) 20 is conventionally used to produce an ac output signal, whose frequency is controlled under and proportional to a control signal. As the VCO 20 is typically a critical circuit in determining the performance of a PLL, it is usually implemented using discrete components, particularly at high frequency. In this embodiment, the operating frequency of the VCO 20 is about 1.9 GHz.

A divide by N circuit 22 inputs the ac output signal from the VCO 20, and generates a division signal whose frequency is N division of the ac signal from the VCO 20, where N is an integer. In this embodiment, a programmable digital divider is used. It is appreciated that a digital divider having fixed division ratio can be used instead, and a conventional analog divider can be used for implementing a fast switching analog PLL.

The phase difference of the divided-by-N division signal and a reference signal are then compared by a phase detector 24, which therefore generates a detect signal proportional to that phase difference. The phase detector 24 in the embodiment can be implemented by a sample-and-hold circuit, where one of the two inputs to the phase detector 24 is used to sample the other input. Afterwards, the sampled input is held using a capacitor. Alternatively, the phase detector 24 can be made using an exclusive OR gate to digitally multiply the two inputs. Both of the aforementioned methods require, for example, firstly sweeping the VCO 20 in order to lock the frequency. Furthermore, a third method commonly called sequential phase detection can be used. This type of phase detector not only matches the phase but also achieving the same frequency without additional circuit. It is appreciated that a conventional analog multiplier, which is often referred to as mixer, may be used in making a fast switching PLL according to the present invention.

The detect signal from the phase detector 24 is fed respectively to the first charge pump 240 and the second charge pump 242. Both charge pump 240 and charge pump 242 are used in a digital PLL as an interface circuit between the phase detector 24 and the first/second loop filter 260 and 262. It is understood that both the charge pumps 240 and 242 can be omitted in making a fast switching analog PLL according to the present invention. It is noted that the power of the first charge pump 240 is turned down after a first portion period lapses, about 300 $\mu$s in this embodiment, therefore preventing the detect signal from passing to the first loop filter 260.

Both the first loop filter 260 and the second loop filter 262 are used to shape the response of the PLL. In this embodiment, the bandwidth is about 30 KHz for the first loop filter 260, and is about 2 KHz for the second loop filter 262. There are two conventional ways to implement the loop filters: the passive circuit such as a low-pass RC circuit, and the active circuit such as an RC closed loop circuit using an operational amplifier.

According to the aforementioned particulars, the output signal from the first charge pump 240 passes through the first loop filter 260 in the first portion period, therefore making the ac output signal of the VCO 20 almost follow the reference signal in a very short time due to the large bandwidth (or fast response) of the first loop filter 260. After the first (short) period lapses, the path through the first charge pump 240 and the first loop filter 260 is prohibited by turning down the power of the first charge pump 240. Thereafter, the detect signal from the phase detector 24 detours to the second charge pump 242 and the second loop filter 262. The noise is thus substantially reduced due to the narrow bandwidth of the second loop filter 262. Compared with a conventional PLL circuit, the PLL circuit according to the present invention has a fast switching time or response time due to the large bandwidth of the first loop filter 260. Furthermore, the present invention accumulates less noise due to the fact that during a later period, about 300 $\mu$s in the embodiment, little noise is incurred because of the narrow bandwidth in the second loop filter 262.

Figure 3A:
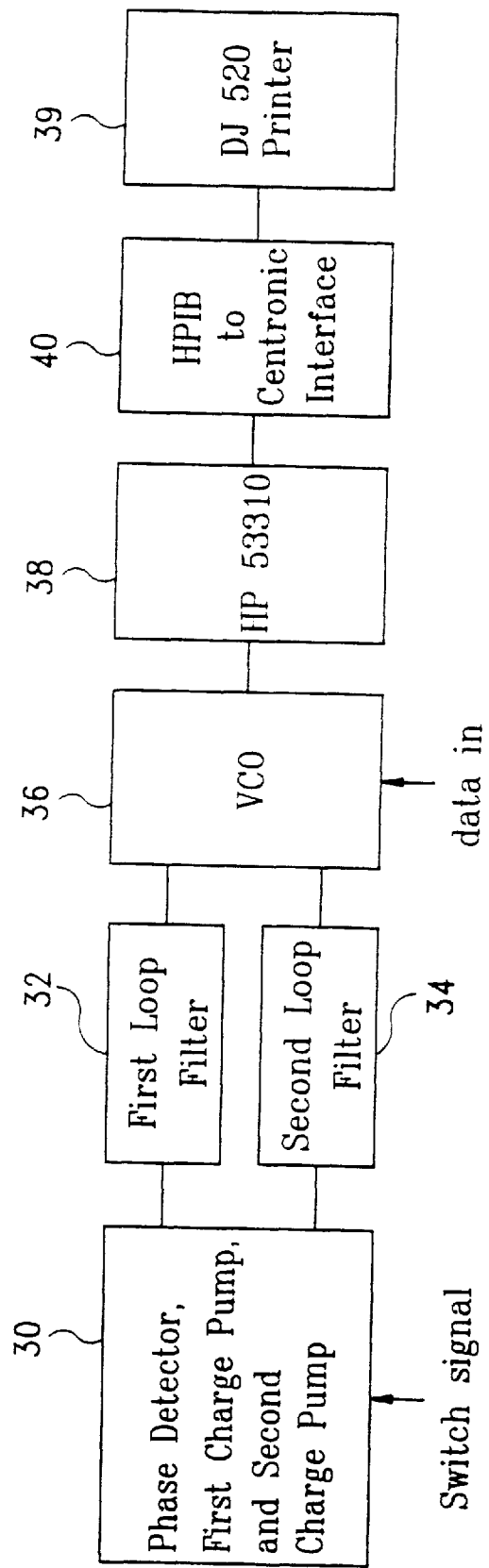
FIG. 3A shows the block diagram of a test set-up for measuring the response of the embodiment according to the present invention.
Figure 3B:
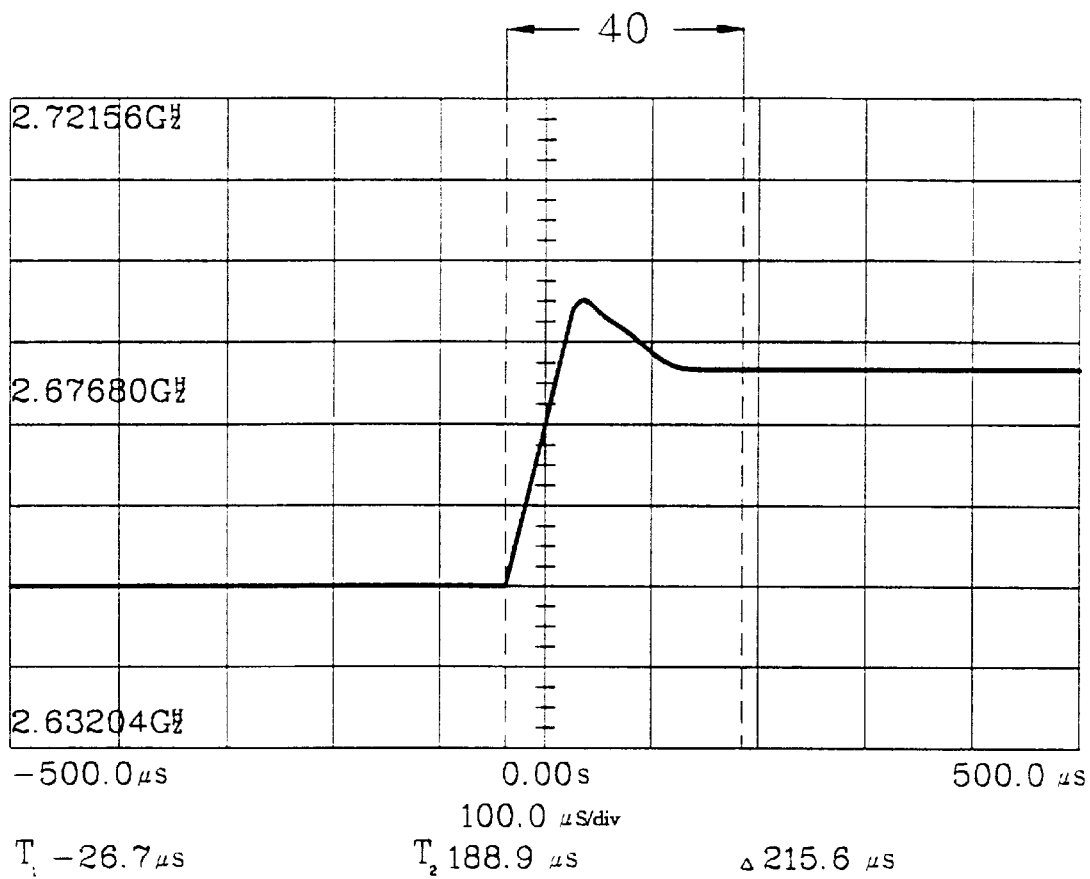
FIG. 3B shows a print-out of the response during the first period of the embodiment according to the present invention.
Figure 3C:
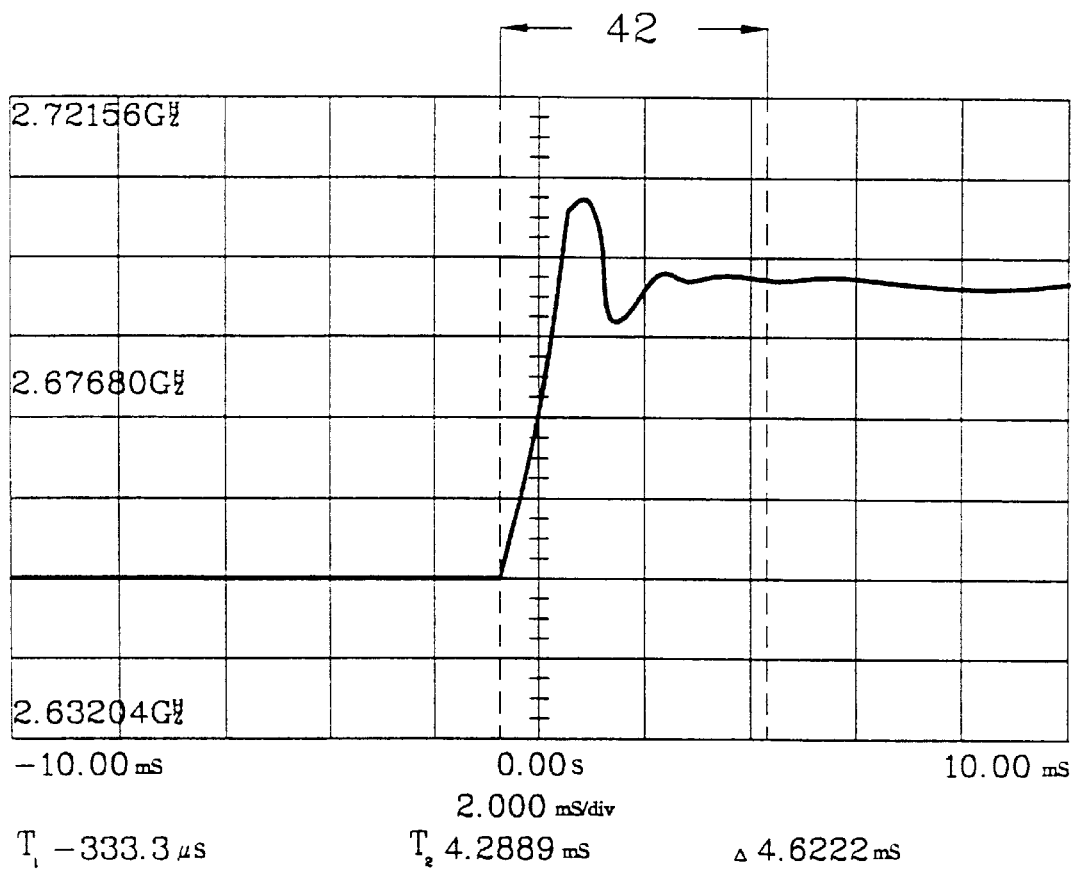
FIG. 3C shows a print-out of the response during the second period of the embodiment according to the present invention.
Figure 3D:
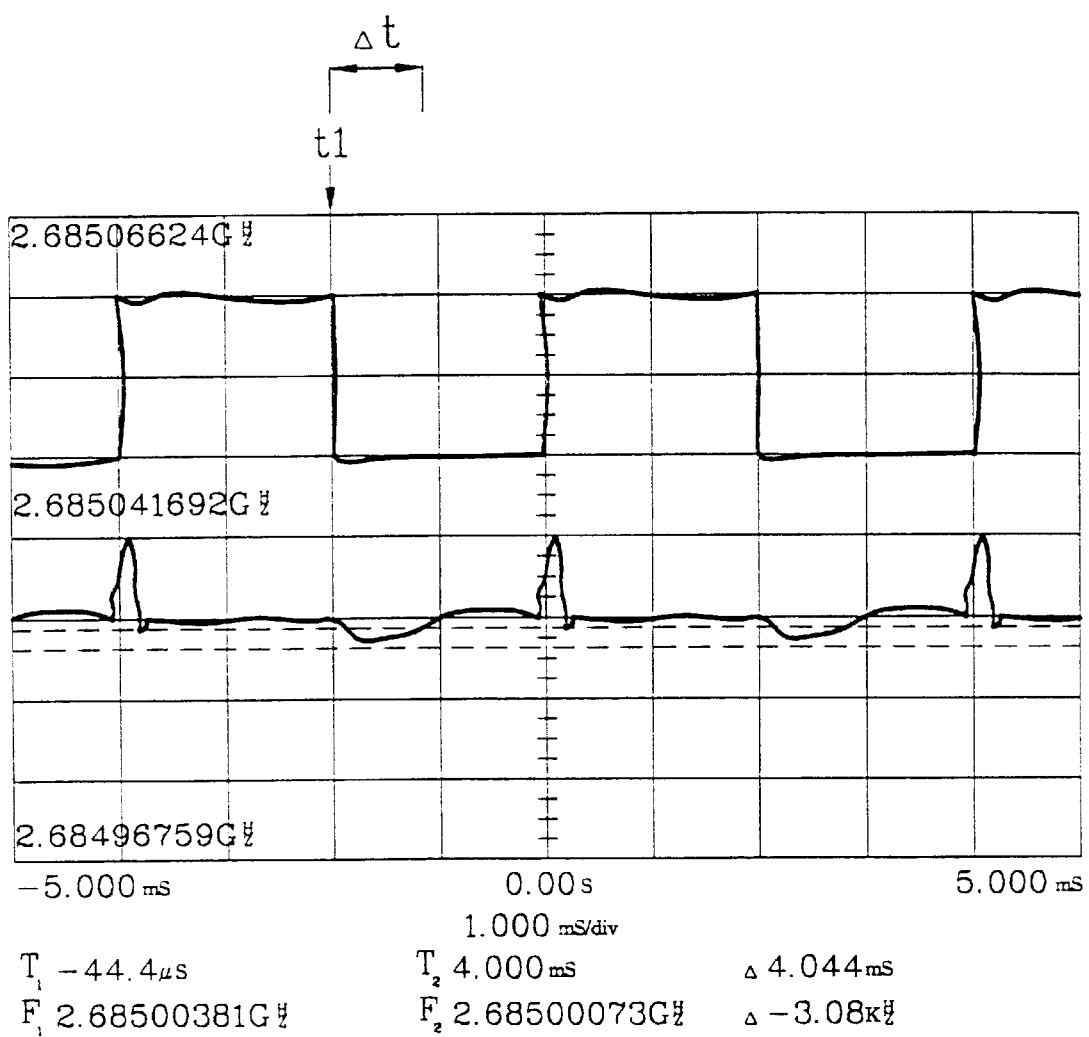
FIG. 3D shows the recovery of the VCO when the first loop filter switches to the second loop filter according to the present invention.

FIG. 3A shows the block diagram of a test set-up for measuring the response of the embodiment according to the present invention. The block 30 includes the phase detector 24 (FIG. 2), the first charge pump 240 and the second charge pump 242. The blocks 32 and 34 represent respectively the first loop filter and the second loop filter, followed by a VCO 36. It is noted that the divide by N circuit (FIG. 2) is not shown here for its simplicity. The response of the VCO 36 is measured by an instrument 38 modeled HP53310, whose measurement signal is fed to and printed out by a printer 39 modeled DJ520 via an HPIB-to-Centronic interface 40. FIG. 3B shows a print-out of the response during the aforementioned first period. Due to the wide bandwidth of the first loop filter 32, the switch time 40 of the VCO 36 is very short (215.6 $\mu$s in this measurement). After about 300 $\mu$s, the switch signal into the block 30 is switched so that the path through the first loop filter 32 is prohibited. FIG. 3C shows a print-out of the response during the aforementioned second period. Due to the narrow bandwidth of the second loop filter 34, the switch time 42 of the VCO 36 is longer (4.622 ms) compared to that in the first period. Referring to FIG. 3D, the switching from the first loop filter 32 to the second loop filter 34 occurs at time $t_1$. This figure shows that the VCO 36 recovers soon in time $\Delta t$ (less than 500 $\mu$s in this measurement) from a narrow bandwidth to a wide bandwidth.

Although specific embodiments have been illustrated and described, it will be obvious to those skilled in the art that various modifications may be made without departing from the spirit which is intended to be limited solely by the appended claims.

What is claimed is:

1. A fast switching phase-locked loop, comprising:
   voltage-controlled oscillating means for generating an ac output signal, the frequency of the ac output signal being proportional to a control signal;
   dividing means for generating a division signal, the frequency of the division signal being an integer division of the ac output signal;
   phase detecting means for generating a detect signal that is proportional to a phase difference of the division signal and a reference signal; therefore, the ac output signal being an integer multiple of the reference signal;
   first filter means for shaping a response of the fast switching phase-locked loop during a fore part of switching the fast switching phase-locked loop by generating the control signal according to the detect signal, said first filter means being prohibited during a later part of switching the fast switching phase-locked loop, wherein said first filter means comprises:
   (a) first charge pump means for interfacing the detect signal to said first filter means; and
   (b) first loop filter means for filtering a first output signal from said first charge pump means, thereby generating the control signal; and
   second filter means for shaping the response of the fast switching phase-locked loop during the later part of switching the fast switching phase-locked loop by generating the control signal according to the detect signal, wherein the bandwidth of said first filter means is larger than the bandwidth of said second filter means, and wherein said second filter means comprises:
   (a) second charge pump means for interfacing the detect signal to said second filter means; and
   (b) second loop filter means for filtering a second output signal from said second charge pump means, thereby generating the control signal.

2. The fast switching phase-locked loop according to claim 1, wherein the prohibition of said first filter means is done by turning down the power of said first charge pump means at the beginning of the later part of switching the fast switching phase-locked loop.

3. The fast switching phase-locked loop according to claim 11, wherein the bandwidth of said first loop filter means is about 30 KHz.

4. The fast switching phase-locked loop according to claim 3, wherein the bandwidth of said second loop filter means is about 2 KHz.

5. The fast switching phase-locked loop according to claim 1, wherein the fore part of switching the fast switching phase-locked loop lasts about 300 μs.

6. The fast switching phase-locked loop according to claim 5, wherein the later part of switching the fast switching phase-locked loop lasts about 300 μs.

7. The fast switching phase-locked loop according to claim 1, wherein said dividing means comprises a divide-by-N circuit, where said N is an integer, and the frequency of the division signal is N division of the ac output signal.

8. A fast switching phase-locked loop, comprising:

voltage-controlled oscillating means for generating an ac output signal, the frequency of the ac output signal being proportional to a control signal;

dividing means for generating a division signal, the frequency of the division signal being an integer division of the ac output signal;

phase detecting means for generating a detect signal that is proportional to a phase difference of the division signal and a reference signal; therefore, the ac output signal being an integer multiple of the reference signal;

first filter means for shaping a response of the fast switching phase-locked loop during a fore part of switching the fast switching phase-locked loop by generating the control signal according to the detect signal, said first filter means being prohibited during a later part of switching the fast switching phase-locked loop, wherein said first filter means comprises:

first charge pump means for interfacing the detect signal to said first filter means; and first loop filter means for filtering a first output signal from said first charge pump means, thereby generating the control signal; and second filter means for shaping the response of the fast switching phase-locked loop during the later part of switching the fast switching phase-locked loop by generating the control signal according to the detect signal, wherein the bandwidth of said first filter means is larger than the bandwidth of said second filter means; wherein the prohibition of said first filter means is done by turning down the power of said first charge pump means at the beginning of the later part of switching the fast switching phase-locked loop.

* * * * *

UNITED STATES PATENT AND TRADEMARK OFFICE
CERTIFICATE OF CORRECTION

PATENT NO. : 5,821,789
DATED : October 13, 1998
INVENTOR(S) : Jeng-Shing Lee

It is certified that error appears in the above-identified patent and that said Letters Patent is hereby corrected as shown below:

Title page, item [73], Assignee, change "institution" to --Institute--.

Signed and Sealed this

Ninth Day of March, 1999

Attest:

Attesting Officer

Q. TODD DICKINSON

Acting Commissioner of Patents and Trademarks